US008889472B2

(12) United States Patent
Miller (10) Patent No.: US 8,889,472 B2
(45) Date of Patent: Nov. 18, 2014

(54) DIELECTRIC NANOCOMPOSITES AND METHODS OF MAKING THE SAME

(75) Inventor: Seth Miller, Englewood, CO (US)

(73) Assignee: Empire Technology Development LLC, Wilmington, DE (US)

( * ) Notice: Subject to any disclaimer, the term of this patent is extended or adjusted under 35 U.S.C. 154(b) by 327 days.

(21) Appl. No.: 13/260,899

(22) PCT Filed: Apr. 13, 2011

(86) PCT No.: PCT/US2011/032326
§ 371 (c)(1),
(2), (4) Date: Sep. 28, 2011

(87) PCT Pub. No.: WO2012/141698
PCT Pub. Date: Oct. 18, 2012

(65) Prior Publication Data
US 2012/0295448 A1 Nov. 22, 2012

(51) Int. Cl.
*H01L 51/40* (2006.01)
(52) U.S. Cl.
USPC ......... 438/99; 438/780; 438/785; 257/E21.24
(58) Field of Classification Search
CPC .................. H01L 21/02274; H01L 21/02126; H01L 21/31612; H01L 21/31604
USPC ................... 438/99, 778, 781, 785, 789, 790; 977/773
See application file for complete search history.

(56) References Cited

U.S. PATENT DOCUMENTS

| 5,379,947 | A | 1/1995 | Williams et al. |
| 6,060,755 | A | 5/2000 | Ma et al. |
| 6,703,277 | B1 | 3/2004 | Paton et al. |
| 2004/0067659 | A1 | 4/2004 | Black et al. |
| 2006/0073337 | A1* | 4/2006 | Nauka et al. ................... 428/407 |
| 2006/0163744 | A1* | 7/2006 | Vanheusden et al. ......... 257/773 |
| 2007/0001201 | A1 | 1/2007 | Kil et al. |
| 2008/0242758 | A1 | 10/2008 | Jackson et al. |
| 2010/0127216 | A1 | 5/2010 | Yao et al. |
| 2011/0140525 | A1* | 6/2011 | Miller ............................. 307/66 |

FOREIGN PATENT DOCUMENTS

| WO | WO 01/062830 A2 | 8/2001 |
| WO | 02051922 A2 | 7/2002 |

OTHER PUBLICATIONS

Paton, T.C., "Paint Flow and Pigment Dispersion: A Rheological Approach to Coating and Ink Technology," 2nd edition, Wiley-Interscience, p. 253 (1979).

(Continued)

*Primary Examiner* — Jack Chen
(74) *Attorney, Agent, or Firm* — Knobbe, Martens, Olson & Bear, LLP (57) ABSTRACT

Techniques related to nanocomposite dielectric materials are generally described herein. These techniques may be embodied in apparatuses, systems, methods and/or processes for making and using such material. An example process may include: providing a film having a plurality of nanoparticles and an organic medium; comminuting the film to form a particulate; and applying the particulate to a substrate. The example process may also include providing a nanoparticle film having nanoparticles and voids located between the nanoparticles; contacting the film with a vapor containing an organic material; and curing the organic material to form the nanocomposite dielectric film. Various described techniques may provide nanocomposite dielectric materials with superior nanoparticle dispersion which may result in improved dielectric properties.

15 Claims, 6 Drawing Sheets

(56) References Cited

OTHER PUBLICATIONS

Steele, A., et al., "Inherently Superoleophobic Nanocomposite Coatings by Spray Atomization," *Nano Lett.*, vol. 9, No. 1, pp. 501-505, American Chemical Society, USA (2009).

Yoon, D-H., et al., "Dielectric constant and mixing model of BaTiO3 composite thick films," Materials Research Bulletin, vol. 38, Issue 5, pp. 765-772 (2003).

Ahmadi, M. et al., "Solution processable nanoparticles as high-k dielectric for organic field effect transistors," *Organic Electronics*, vol. 11, pp. 1660-1667, Jul. 29, 2010.

Dang, et al., "Fabrication and Dielectric Characterization of Advanced BaTiO3/Polyimide Nanocomposite Films with High Thermal Stability," *Adv. Fund. Mater.*, 18, pp. 1509-1517, 2008.

Kilaru, M. et al., "Strong charge trapping and bistable electrowetting on nanocomposite fluoropolymer:BaTiO3 dielectrics," *Applied Physics Letters*, vol. 90, pp. 212906-1 to 212906-3, May 24 2007.

Kim, et al, "Solution-processible high-permittivity nanocomposite gate insulators for organic field-effect transistors," *Applied Physics Letters*, 93, 013302, 2008.

Kim, et al., "Phosphonic Acid-Modified Barium Titanate Polymer Nanocomposites with High Permittivity and Dielectric Strength," *Adv. Mater.*, 19, pp. 1001-1005, 2007.

International Search Report mailed Jun. 28, 2011 in PCT/US2011/032326, filed Apr. 13, 2011.

Kim, et al., High Energy Density Nanocomposites Based on Surface-Modified $BaTiO_3$ and a Ferroelectric Polymer, *ACSNANO*, vol. 3, No. 9, op. 2581-2592, 2009.

"Powder coating," accessed at http://en.wikipedia.org/wiki/Powder_coating, Wikipedia Foundation, Inc., last modified Mar. 30, 2013, downloaded Apr. 29, 2013, pp. 5.

"Powder coating," accessed at http://en.wikipedia.org/wiki/Powder_coating, Wikipedia Foundation, Inc., last modified May 1, 2014, downloaded Aug. 5, 2014, pp. 6.

* cited by examiner

DIELECTRIC NANOCOMPOSITES AND METHODS OF MAKING THE SAME

BACKGROUND

Unless otherwise indicated herein, the materials described in this section are not prior art to the claims in this application and are not admitted to be prior art by inclusion in this section.

In general, nanocomposite dielectric materials are composed of two phases: a high-dielectric (or "high-k") inorganic nanoparticle phase and a low-dielectric (or "low-k") polymer. By mixing these two materials on the nanometer scale, it becomes possible to combine the improved dielectric properties of the inorganic material with the dielectric strength of the polymer. The resulting composite can, in theory, store more energy than either of its components. In practice, however, the performance of such composite materials has been far below their theoretical limit.

There are two major methods of preparing nanocomposite dielectric materials. In the first method, nanoparticles are loaded into a base polymer by grinding, to give a thick mass with randomly distributed particles throughout the polymer matrix. However, only small volume fractions of particles can be effectively distributed this way. In the second method, a thin film of nanocomposite can be prepared by conventional solution casting methods, whereby the polymer and nanoparticles are both dissolved in a compatible solvent. This second method is preferred, because it can achieve higher volume fractions of particles, and thinner films, both of which yield improved capacitance.

The present disclosure appreciates that to improve the capacitance further, it would be beneficial to use electrodes with some degree of topography, because a rough or wavy surface can pack more surface area in a small package. However, existing methods for preparing nanocomposites may not be capable of coating rough or wavy surfaces in a uniform fashion. Thus, the present disclosure identifies that a method for coating rough surfaces is needed to further improve capacitance.

SUMMARY

Some embodiments disclosed herein may include a method of making a nanocomposite dielectric film include: providing a nanoparticle film, wherein the film includes nanoparticles and voids located between the nanoparticles; contacting the film with a vapor comprising an organic material so that at least a portion of the organic material occupies at least a portion of the voids; and curing the organic material to form the nanocomposite dielectric film.

Some embodiments disclosed herein may include a method of making a nanocomposite dielectric film include: providing a film, the film includes a plurality of nanoparticles and an organic medium; comminuting the film to form a particulate; and applying the particulate to a substrate under conditions sufficient to adhere the particulate to the substrate and form a nanocomposite dielectric film.

Some embodiments disclosed herein may include a nanocomposite dielectric film including: a plurality of nanoparticles dispersed within an organic medium, where the nanocomposite dielectric film has an average nanoparticle density, and where the nanocomposite dielectric film has a nanoparticle density distribution within the range of about 90% to about 110% of the average nanoparticle density along a thickness of the film.

Some embodiments disclosed herein may include a capacitor including: a first electrode; a second electrode; and a nanocomposite dielectric film disposed between the first and second electrodes, where the nanocomposite dielectric film comprises a plurality of nanoparticles dispersed within an organic medium, where the nanocomposite dielectric film has an average nanoparticle density, and where the nanocomposite dielectric film has a nanoparticle density distribution within the range of about 90% to about 110% of the average nanoparticle density along a thickness of the nanocomposite dielectric film.

Some embodiments disclosed herein may include an FET transistor comprising: a gate electrode; a channel region; and a nanocomposite dielectric film disposed between the gate electrode and the channel region, where the nanocomposite dielectric film comprises: a plurality of nanoparticles dispersed within an organic medium, where the nanocomposite dielectric film has an average nanoparticle density, and where the nanocomposite dielectric film has a nanoparticle density distribution within the range of about 90% to about 110% of the average nanoparticle density along a thickness of the nanocomposite dielectric film.

Some embodiments disclosed herein may include a system including: a controller configured to execute instructions to facilitate making a nanocomposite dielectric film; a fluid delivery device coupled to the controller, where the fluid delivery device is configured via the controller to provide a fluid to a nanoparticle film at conditions sufficient to cause the fluid to occupy at least a portion of voids in the nanoparticle film; and a curing device coupled to the controller, where the curing device configured via the controller to cure the fluid in the nanoparticle film to form the nanocomposite dielectric film.

Some embodiments disclosed herein may include a system including: a controller configured to execute instructions to facilitate a method of making a nanocomposite dielectric film; a comminution device coupled to the controller, where the comminution device is configured via the controller to comminute a film, the film including a plurality of nanoparticles and an organic medium into a particulate; an applicator coupled to the controller, where the applicator is configured via the controller to apply the particulate to a substrate to form the nanocomposite dielectric film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn to, inter alia, methods, apparatus, systems, devices, and computer program products related to nanocomposite dielectric materials.

Briefly stated, techniques related to nanocomposite dielectric materials are generally described herein. These techniques may be embodied in apparatuses, systems, methods and/or processes for making and using such material. An example process may include: providing a film having a plurality of nanoparticles and an organic medium; comminuting the film to form a particulate; and applying the particulate to a substrate. The example process may also include providing a nanoparticle film having nanoparticles and voids located between the nanoparticles; contacting the film with a vapor containing an organic material; and curing the organic material to form the nanocomposite dielectric film. Various described techniques may provide nanocomposite dielectric materials with superior nanoparticle dispersion which may result in improved dielectric properties.

The present application may also include, for example, nanocomposite dielectric materials formed by the disclosed methods, apparatuses and devices that include the nanocomposite dielectric materials, systems configured to perform the disclosed methods, and computer program products with instructions to facilitate performing the disclosed methods.

As presented above, a nanocomposite dielectric material composed of a high-k inorganic nanoparticle phase and a low-k polymer can be adapted to effectively store more energy than either of its components. In practice, however, the performance of such composite materials has been far below their theoretical limit.

The present disclosure appreciates that various shortcomings in the composite materials used in dielectrics may be partially due to the way the materials are cast. For example, in one example method, the inorganic particles can be coated with an organic group to make it compatible with the solvent. The inorganic particles and polymer components may then be dissolved in the solvent. Lastly, the solvent can be removed as part of deposition of a composite film, e.g., during spin-coating. Unless the inorganic nanoparticles and the polymer fall out of solution at exactly the same rate, there may be inhomogeneities in the cast material. For example, if the polymer is slightly less soluble than the nanoparticle, then the bottom of the film may be polymer-rich, and the top of the film may be nanoparticle-rich. These inhomogeneities may reduce the total capacitance of the film. Thus, the present disclosure appreciates that improved methods of forming nanocomposite dielectrics are needed that do not phase separate.

Figure 1:
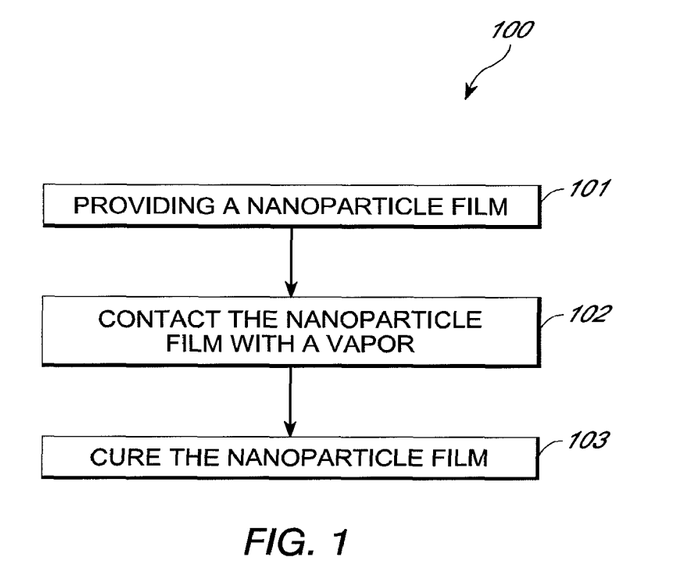
FIG. 1 is a flow diagram illustrating one example of a method of making a nanocomposite dielectric film in accordance with at least some examples of the present disclosure.

FIG. 1 is a flow diagram illustrating one example of a method 100 of making a nanocomposite dielectric film, in accordance with at least some examples of the present disclosure. The flow diagram is one example of a process within the scope of the invention. As illustrated in FIG. 1, the method 100 may include one or more functions, operations, or actions as illustrated by one or more of operations 101-103. Operations 101-103 may include a "Provide a Nanoparticle Film" operation 101, a "Contact the Nanoparticle Film with a Vapor" operation 102, and/or a "Cure the Nanoparticle Film" operation 103.

In FIG. 1, operations 101-103 are illustrated as being performed sequentially, with operation 101 first and operation 103 last. It will be appreciated however that these operations may be re-ordered as convenient to suit particular embodiments, and that these operations or portions thereof may be performed concurrently in some embodiments.

Method 100 may begin at operation 101, "Provide a Nanoparticle Film." In operation 101, a generally uniform film of nanoparticles can be provided. In some embodiments, the nanoparticles may be provided by solvent casting the nanoparticles onto a substrate. The nanoparticles may, for example, be dispersed in a carrier solvent that does not include a polymer component. This mixture can be applied to a substrate by spin-coating to provide the nanoparticle film. In some embodiments, a pre-formed nanoparticle may be provided.

In some embodiments, the resulting nanoparticle film can include voids or interstitial regions between the nanoparticles in the film. However, casting the nanoparticles onto the surface without using a polymer component, may result in a higher density or closer packing of the nanoparticles than is conventionally obtained.

The size and shape of the nanoparticles is not particularly limited. The nanoparticles can be, for example, spherical or semi-spherical structures synthesized from inorganic materials such as metals, metal oxides, alloys, semiconducting materials, and the like. In some examples, the nanoparticles may have an average diameter of less than about 1,000 nm. For example, the nanoparticles may have an average diameter of less than about 500 nm; less than about 250 nm; less than about 100 nm; less than about 75 nm; less than about 60 nm; or less than about 50 nm. In some examples, the nanoparticles may have an average diameter of at least about 1 nm; at least about 5 nm; at least about 10 nm; at least about 20 nm; at least about 30 nm; or at least about 50 nm. In some embodiments, the nanoparticles may have an average diameter in a range of about 1 nm to about 1,000 nm. In some embodiments, the nanoparticles may have an average diameter in a range of about 5 nm to about 500 nm. In some embodiments, the nanoparticles may have an average diameter in a range of about 10 nm to about 100 nm.

The nanoparticles may include a material having a high dielectric constant. For example, the nanoparticles may include a material having a dielectric constant greater than silicon dioxide ($SiO_2$). In some embodiments, the nanoparticles may include a material having a dielectric constant greater than about 3.9. The nanoparticle may include, for example, a material having a dielectric constant greater than about 3.9; greater than about 5; greater than about 7; greater than about 10; greater than about 12; greater than about 15; or greater than about 20.

In some embodiments, the nanoparticles may include one or more metal oxides. These metal oxide-containing nanoparticles can be purchased commercially or created using conventional methods. Non-limiting examples of suitable materials for the nanoparticles include hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN (Pb-$Mg_xNb_{1-x}O_3$), PZT ($PbZr_xTi_{1-x}O_3$), PZN ($PbZn_xNb_{1-x}O_3$), PST ($PbSc_xTa_{1-x}O_3$), and/or combinations thereof. In some embodiments, x may be in the range of about 0.01 to about 0.99.

The total amount of the high-dielectric material (e.g., any of the metal oxides disclosed above, such as barium titanate) may be effective for the nanocomposite dielectric film to exhibit a high a dielectric constant. The amount of the one or more high-dielectric materials in the nanoparticle can be, for example, at least about 25% by weight; at least about 50% by weight; at least about 75% by weight; at least about 90% by weight; or at least about 95% by weight.

The nanoparticles may optionally be modified so that they are compatible with the carrier solvent. For example, a surface modifying agent or capping agent may be used in order to reduce the surface tension between the nanoparticles and the carrier solvent.

In some embodiments, the nanoparticles may include a core and an outer layer. The core may include, for example, any of the high-dielectric materials described in the present application (e.g., yttrium oxide or $Y_2O_3$). The outer layer may include a surface modifying agent conjugated to the core. In some embodiments, the surface modifying agent may include a functional group selected from the group consisting of a phosphonic acid, a siloxane, a carboxylic acid, and/or combinations thereof. The functional groups may be, for example, a phosphonic acid-terminated polyethylene glycol, a siloxane-terminated polyethylene glycol, and/or a carboxylic acid-terminated polyethylene glycol.

Operation 101 may be followed by operation 102, "Contact the Nanoparticle Film with a Vapor." In operation 102, the nanoparticle film can be introduced to an organic vapor that can infiltrate the voids between the nanoparticles. As one example, the nanoparticle film can be heated in the presence of the organic vapor. The pressure and/or temperature may be such that the organic vapor is above its boiling point, yet it will condense inside the pores of the nanoparticle film because of their high capillary pressure. For example, the capillary pressure associated with a film of 100 nm particles and a liquid of 30 dyne/cm may be approximately 580 psi; where this capillary pressure may be sufficient to capture at least a portion of the organic vapor that is heated to a few degrees its nominal boiling conditions.

Suitable organic vapors include, for example, vinyl monomers and epoxides. In some embodiments, the organic material is 2-methyl-2-vinyloxirane. In some embodiments, the organic material is selected from 1,3-hexadiene or 1,4-hexadiene or 1,4-divinylbenzene.

Operation 102 may be followed by operation 103, "Cure the Nanoparticle Film." In operation 103, the nanoparticle film including the organic vapor can be cured to form a solid composite. For example, the nanoparticle film may be removed from the vapor and curing may be performed by any curing technique. Non-limiting examples of curing techniques include applying heat to the nanoparticle film, contacting the nanoparticle film with an acid, and/or exposing the nanoparticle film to ultraviolet or gamma radiation.

It should be understood that the organic material, e.g. the condensed organic vapor, is being cured during the curing process. In some examples, the curing occurs in situ and can be achieved via cross-linking the organic material and/or polymerizing the organic material. In some embodiments, the resulting cured organic medium has a dielectric strength that can be greater than the high-k material in the nanoparticles. For example, the cured organic medium may have a dielectric strength greater than the dielectric strength of barium titanate ($BaTiO_3$) within the nanoparticles. The resulting cured organic medium can exhibit a dielectric strength of, for example, at least about 10 MV/m; at least about 15 MV/m; at least about 20 MV/m; or at least about 25 MV/m.

Figure 2:
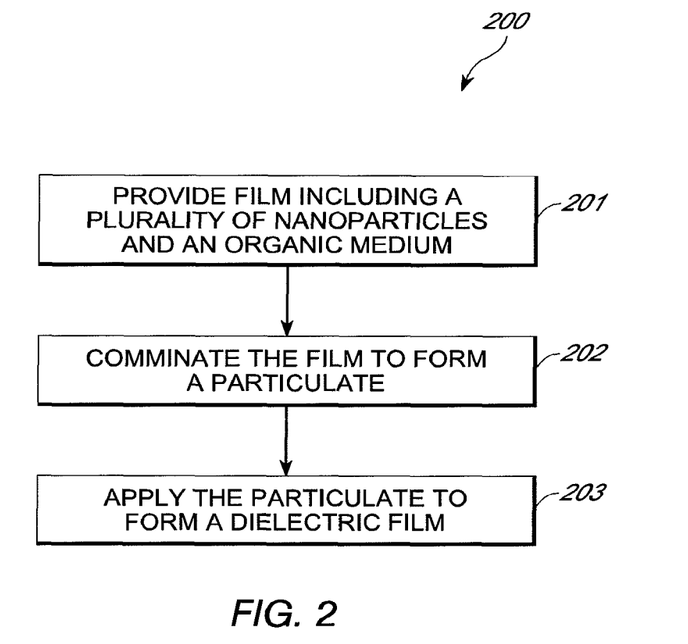
FIG. 2 is a flow diagram illustrating one example of a method of making a nanocomposite dielectric film in accordance with at least some examples of the present disclosure.

FIG. 2 is a flow diagram illustrating one example of a method 200 of making a nanocomposite dielectric film, in accordance with at least some examples of the present disclosure. As illustrated in FIG. 2, the method 200 may include one or more functions, operations, or actions as illustrated by one or more of operations 201-204. Operations 201-204 may include a "Provide a Film Including a Plurality of Nanoparticles and an Organic Medium" operation 201, a "Comminute the Film to Form a Particulate" operation 202, an "Apply the Particulate to a Substrate to Form a Dielectric Film" operation 203, and/or a "Cure the Dielectric Film" operation 204.

In FIG. 2, operations 201-204 are illustrated as being performed sequentially, with operation 201 first and operation 204 last. It will be appreciated however that these operations may be re-ordered as convenient to suit particular embodiments, and that these operations or portions thereof may be performed concurrently in some embodiments.

Method 200 may begin at operation 201, "Provide a Film Including a Plurality of Nanoparticles and an Organic Medium." In operation 201, a plurality of nanoparticles is mixed with a polymer to form a nanocomposite film using any existing method. In some embodiments, the nanocomposite film can be formed according to the method described in FIG. 1.

In some examples, the nanocomposite film can be formed by conventional methods. For example, the nanocomposite film can be formed by treating nanoparticles with a surface modifying agent and dissolving the nanoparticles in a carrier solvent with a polymer component. The solvent can be removed to yield the nanocomposite film.

The nanoparticles in the film can be any of the high-dielectric nanoparticles disclosed in the present application (e.g., barium titanate nanoparticles). The polymer in the nanocomposite film may be chosen to have a melting point and/or glass transition temperature of greater than about 40° C. Also, the melting point and/or glass transition temperature may be less than the decomposition temperature of a substrate or any other system component used during manufacturing. The polymer may also have a high dielectric strength. The dielectric strength can be, for example, at least about 10 MV/m; at least about 15 MV/m; at least about 20 MV/m; or at least about 25 MV/m. The polymer can be, in some embodiments, a polyolefin, such a polyethylene, polypropylene, polybutene-1, polymethylpentene, and the like.

The amount of polymer in the film is not particularly limited and can be any amount that can be selected to improve the dielectric strength of the final nanocomposite dielectric film. The volume fraction of the polymer in the film can be, for example, at least about 5%; at least about 10%; at least about 25%; at least about 50%; at least about 75%; or at least about 90%. The volume fraction of the polymer in the film can be, for example, less than about 95%; less than about 90%; less than about 75%; less than about 50%; less than about 25%; or less than about 10%.

The amount of nanoparticles in the film is not particularly limited and can be any amount that may be selected to improve the dielectric constant of the final nanocomposite dielectric film. The volume fraction of the nanoparticles in the film can be, for example, at least about 5%; at least about 10%; at least about 25%; at least about 50%; at least about 75%; or at least about 90%. The volume fraction of the nanoparticles in the film can be, for example, less than about 95%; less than about 90%; less than about 75%; less than about 50%; less than about 25%; or less than about 10%.

Operation 201 may be followed by operation 202, "Comminute the Film to Form a Particulate." In operation 202, the nanocomposite film can be reduced to particulate. Any suitable method or apparatus for reducing the nanocomposite film to particulate may be used. For example, cryogenic grinding can be used to form particulates.

The size of the particulate produced in operation 202 is not particularly limited. The particulate may have an average size of, for example, at least about 1 μm; at least about 10 μm; at least about 20 μm; at least about 30 μm; or at least about 40 μm. The particulate may also have an average size of, for example, less than about 500 μm; less than about 200 μm; less than about 100 μm; less than about 70 μm; less than about 60 μm; or less than about 50 μm. In some embodiments, the particulate has an average size of about 30 μm to about 50 μm.

Operation 202 may be followed by operation 203, "Apply the Particulate to a Substrate to Form a Dielectric Film." In operation 203, the powder can be applied onto a substrate using conventional powder coating or powder slurry processes. For example, a conventional powder coating process can include a gas carrier to apply the powder. The particles can be less than about 100 μm in size, and in some examples with a size in a range of about 30-50 μm when applied using this technique. In another example, a powder slurry including a solvent (e.g., water or an organic solvent) as the carrier can be used to apply the particulate. The particulates can have a size of less than about 10 μm, or in a range of about 3-5 μm when applied using a powder slurry. In light of the present disclosure, it is appreciated that slurry coating may provide thinner films relative to conventional methods.

Still referring to operation 203, in some embodiments, the substrate may be heated to a temperature that is above the glass transition or melting point of the polymer in the particulate such that the particulate adheres to the substrate. Alternately, in some embodiments, the particulate may be annealed at a temperate above the glass transition temperature of the polymer. In some embodiments, the particulate is annealed at a temperate above the melting temperature of the polymer. It is believed that these heating or annealing steps may promote adhesion between the particulates and the substrate in forming the dielectric film.

In some embodiments, during the heating or annealing step, pressure may be applied to the particulate to further promote adhesion to the substrate. For example, a roller or other mechanical device may be used to exert pressure onto the particulates during and/or after the heating or annealing step. The pressure can be, for example, at least about 2 atm; at least about 5 atm; or at least about 10 atm.

In some embodiments, during operation 203, the heating may cause the particulate to reflow over the substrate surface. One possible benefit of the present process is that the nanocomposites produced by this process are capable of coating irregular surfaces (e.g., rough, curved or wavy surfaces) that can result in increasing the electrode surface area and improving capacitance.

Operation 203 may be followed by operation 204, "Cure the Dielectric Film" In operation 204, the dielectric film can be optionally cured by any suitable method. For example, curing may be achieved by applying heat to the dielectric film, contacting the dielectric film with an acid, exposing the dielectric film to electron beam radiation, and/or exposing the dielectric film to gamma radiation. The curing step may, for example, harden the polymer to fix the nanocomposite dielectric film into its final structure.

In some embodiments, the processes described in either FIG. 1 or FIG. 2 can include an optional operation (not shown) of disposing the nanocomposite dielectric film between components that are configured to have a voltage applied between the components. For example, as discussed further below, the nanocomposite dielectric film can be disposed between two electrodes (e.g., a capacitor depicted in FIG. 6). As another example, which is again discussed further below, the nanocomposite dielectric film can be disposed between a gate and a channel (e.g., in a transistor depicted in FIG. 7). This operation may be performed, at least in part, concurrently or sequentially with other operations.

Figure 3A:
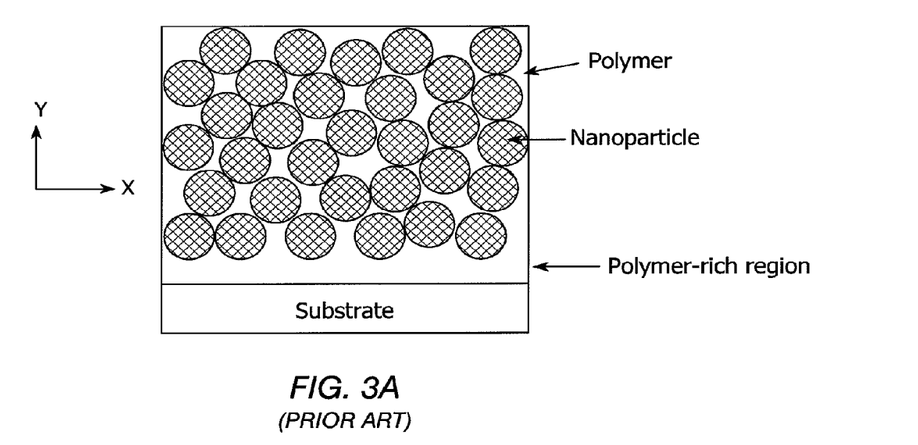
FIG. 3A is a diagram illustrating one example of the nanoparticle distribution of a typical composite film prepared by conventional solvent casting methods.

FIG. 3A is a diagram illustrating one example of the nanoparticle distribution of a typical composite film prepared by conventional solvent casting methods. As explained above, a conventional method of forming nanoparticle composites may be to cast both the nanoparticles and polymer from a liquid, and try to tune the system so that the two components fall out of solution at the same rate. The polymer may precipitate from solution either slightly before or slightly after the nanoparticles. This may result in a polymer-rich region at the bottom or top of the film.

The conventional approach shown in FIG. 3A may lead to two undesirable effects: first, the phase separation during solvent removal may create a series capacitor, with a small film of organic material, e.g. polymer, separating an electrode from the true nanocomposite film. As shown, there is a region with a lower nanoparticle density at the bottom of the thickness of the film, e.g. along the y-axis, as a result of the polymer precipitating from solution at a faster rate than the nanoparticles. This region with lower nanoparticle density, e.g., the region at the bottom of the thickness of the film depicted in FIG. 3A, may cause lower capacitance when using the nanocomposite dielectric film in a capacitor.

Second, because the polymer is not evenly distributed in the composite, the composite may include voids that may increase the likelihood of dielectric breakdown. Alternatively, the composite can include additional polymer selected to compensate for the uneven distribution, which may reduce the dielectric constant of the resulting composite.

Figure 3B:
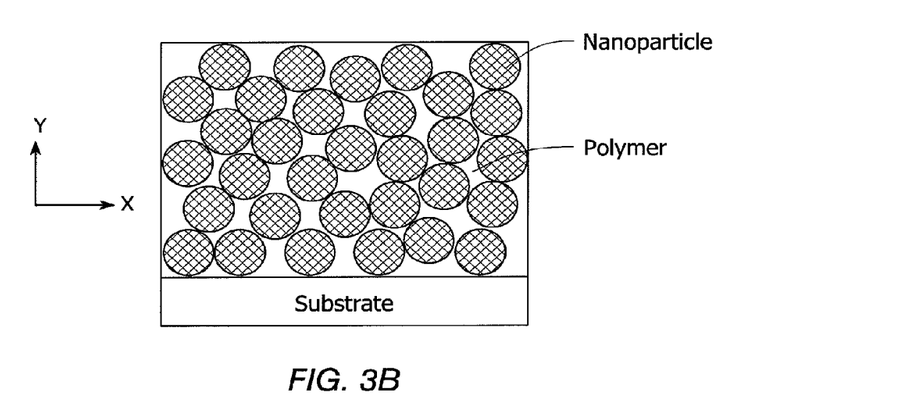
FIG. 3B is a diagram illustrating one example of the nanoparticle distribution of a composite film prepared in accordance with at least some methods of the present application.

FIG. 3B is a diagram illustrating one example of the nanoparticle distribution of a composite film prepared in accordance with at least some methods of the present application. As is easily appreciated, the film prepared using some of the methods of the present application (e.g., the methods depicted in FIG. 1 and FIG. 2) may have evenly distributed nanoparticles along the thickness of the film, e.g., along the y-axis. The described methods are not prone to phase separation. In some embodiments, the amount of organic material required is the minimum necessary to fill the pores between the particles.

Figure 3C:
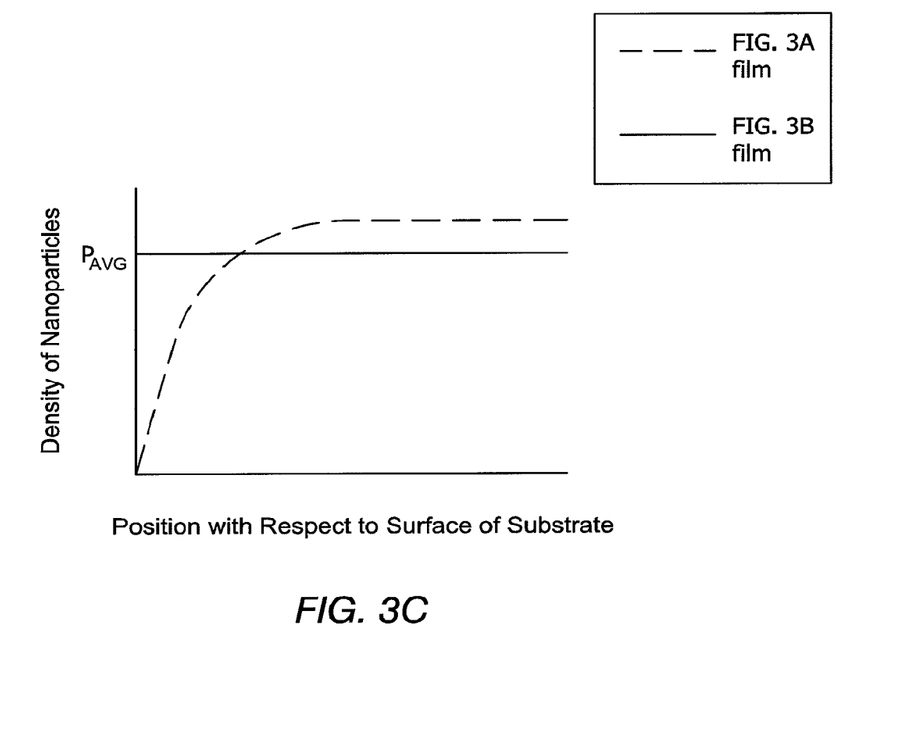
FIG. 3C is a graph comparing the density distribution of the films depicted in FIG. 3A and FIG. 3B.

FIG. 3C is a graph comparing the density distribution of the films depicted in FIG. 3A and FIG. 3B. The x-axis on the graph is the relative position along the thickness of the graph (e.g., along the y-axis as shown in FIG. 3A and FIG. 3B), where '0' is the bottom surface of the film and 'L' is the top surface. The y-axis on the graph is the density of nanoparticles at the relative position. As can be appreciated, the nanoparticle density along the thickness of the film made in accordance with conventional solution casting has an average nanoparticle density that tapers or falls off at length 0. In contrast, the nanoparticle density along the thickness of the film made in accordance with various methods of the present application has a generally uniform nanoparticle density the entire length L of the film.

In some embodiments, the nanocomposite dielectric film has a nanoparticle density distribution within the range of about 90% to about 110% of the average nanoparticle density along a thickness of the film. In some embodiments, the nanocomposite dielectric film has a nanoparticle density distribution within the range of about 95% to about 105% of the average nanoparticle density along a thickness of the film. In some embodiments, the nanocomposite dielectric film has a nanoparticle density distribution within the range of about 98% to about 102% of the average nanoparticle density along a thickness of the film.

The amount of organic medium in the final nanocomposite dielectric film is not particularly limited and can be any amount that can be selected to improve the dielectric strength of the final nanocomposite dielectric film. The volume fraction of the organic medium in the final nanocomposite dielectric film can be, for example, at least about 5%; at least about 10%; at least about 25%; at least about 50%; at least about 75%; or at least about 90%. The volume fraction of the organic medium in the final nanocomposite dielectric film can be, for example, less than about 95%; less than about 90%; less than about 75%; less than about 50%; less than about 25%; or less than about 10%.

The amount of nanoparticles in the final nanocomposite dielectric film is not particularly limited and can be any amount that improves the dielectric constant of the final nanocomposite dielectric film. The volume fraction of the nanoparticles in the final nanocomposite dielectric film can be, for example, at least about 5%; at least about 10%; at least about 25%; at least about 50%; at least about 75%; or at least about 90%. The volume fraction of the nanoparticles in the final nanocomposite dielectric film can be, for example, less than about 95%; less than about 90%; less than about 75%; less than about 50%; less than about 25%; or less than about 10%.

Figure 4:
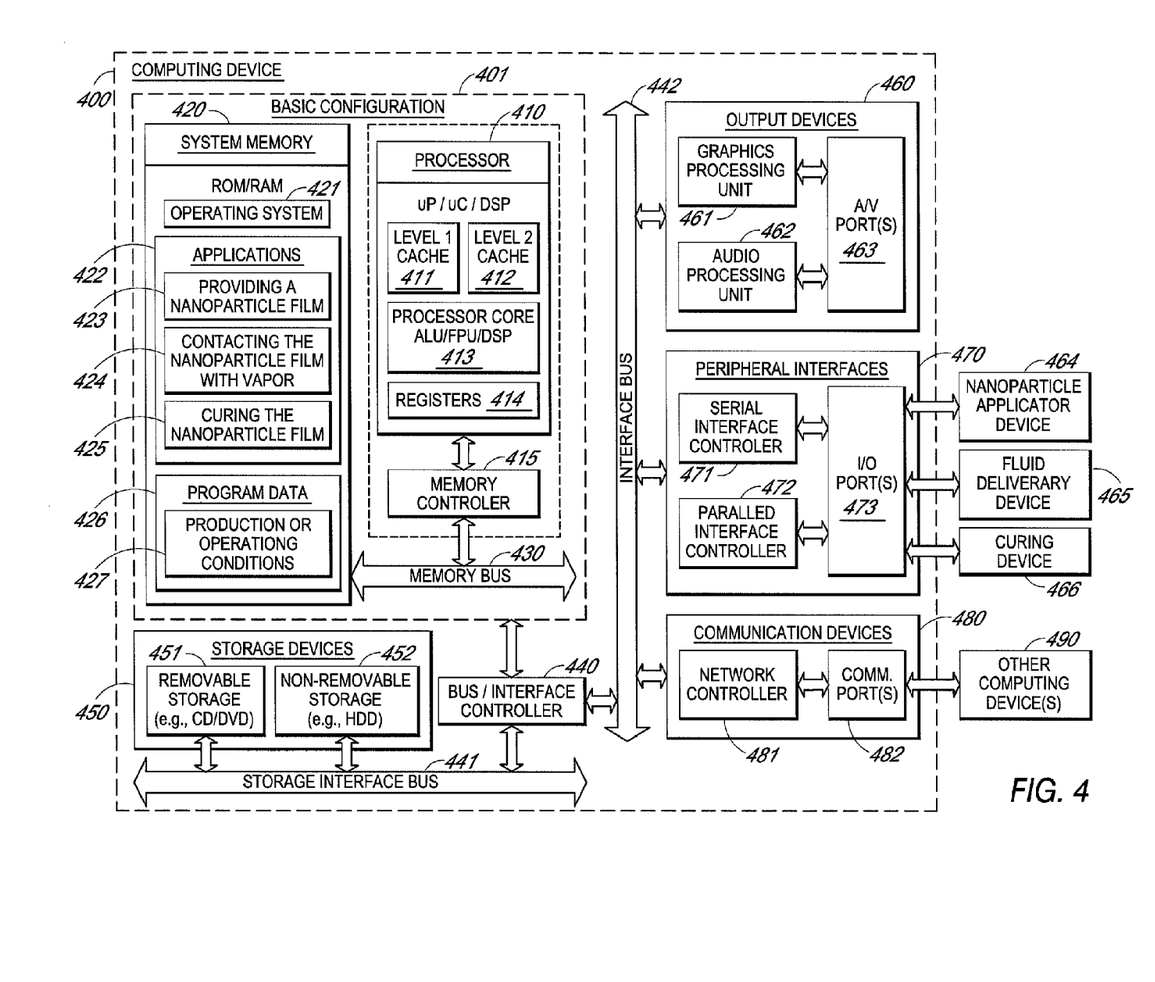
FIG. 4 is a block diagram illustrating showing one example of a computing device that may be configured to control one or more operations in accordance with at least some examples of the present disclosure.

FIG. 4 is a block diagram illustrating one example of a computing device that may be configured to control one or more operations in accordance with at least some examples of the present disclosure. For example, operations for the flow diagrams of FIGS. 1 and/or 2 may be performed by computing device 400 including, but not limited to, providing a nanoparticle film 423, contacting the nanoparticle film with a vapor 424, and curing the nanoparticle film 425. While the operations for the flow diagram of FIG. 1 are shown, the operations associated with FIG. 2 may alternatively be performed by computing device 400. In a very basic configuration, computing device 400 typically includes one or more controllers or processors 410 and system memory 420. A memory bus 430 may be used for communicating between the processor 410 and the system memory 420.

Depending on the desired configuration, processor 410 may be of any type including but not limited to a microprocessor (µP), a microcontroller (µC), a digital signal processor (DSP), or any combination thereof. Processor 410 may include one or more levels of caching, such as a level one cache 411 and a level two cache 412, a processor core 413, and registers 214. The processor core 413 may include an arithmetic logic unit (ALU), a floating point unit (FPU), a digital signal processing core (DSP Core), or any combination thereof. A memory controller 415 may also be used with the processor 410, or in some implementations the memory controller 415 may be an internal part of the processor 410.

Depending on the desired configuration, the system memory 420 may be of any type including but not limited to volatile memory (such as RAM), non-volatile memory (such as ROM, flash memory, etc.), or any combination thereof. System memory 420 typically includes an operating system 421, one or more applications 422, and program data 426. As discussed above, applications 423-425 may include, for example, providing a nanoparticle film, contacting the nanoparticle film with a vapor, and curing the nanoparticle film. Program data 426 may include, for example, nanoparticle film production data and/or operating conditions data 427 that may be used by one or more of applications 423-425.

Computing device 400 may have additional features or functionality, and additional interfaces to facilitate communications between the basic configuration 401 and any required devices and interfaces. For example, a bus/interface controller 440 may be used to facilitate communications between the basic configuration 401 and one or more data storage devices 450 via a storage interface bus 441. The data storage devices 450 may be removable storage devices 451, non-removable storage devices 452, or a combination thereof Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives, to name a few. Example computer storage media may include volatile and nonvolatile, removable and non-removable media implemented in any method or technology for storage of information, such as computer readable instructions, data structures, program modules, or other data.

System memory 420, removable storage 451, and non-removable storage 452 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium that may be used to store the desired information and that may be accessed by computing device 400. Any such computer storage media may be part of device 400.

Computing device 400 may also include an interface bus 442 for facilitating communication from various interface devices (e.g., output interfaces, peripheral interfaces, and communication interfaces) to the basic configuration 401 via the bus/interface controller 440. Example output devices 460 include a graphics processing unit 461 and an audio processing unit 462, which may be configured to communicate to various external devices such as a display or speakers via one or more AN ports 463. Example peripheral interfaces 470 include a serial interface controller 471 or a parallel interface controller 472, which may be configured to communicate with external devices such as input devices (e.g., keyboard, mouse, pen, voice input device, touch input device, etc.) or other peripheral devices (e.g., printer, scanner, etc.) via one or more I/O ports 473. For example, in some embodiments, nanoparticle applicator device 464, fluid delivery device 465, and/or curing device 466 may be optionally connected via an I/O port and used to deposit nanoparticles onto a substrate. An example communications device 480 includes a network controller 481, which may be arranged to facilitate communications with one or more other computing devices 490 over a network communication via one or more communication ports 482.

The communications connection is one example of a communication media. Communication media may typically be embodied by computer readable instructions, data structures, program modules, or other data in a modulated data signal, such as a carrier wave or other transport mechanism, and include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR), and other wireless media.

Figure 5:
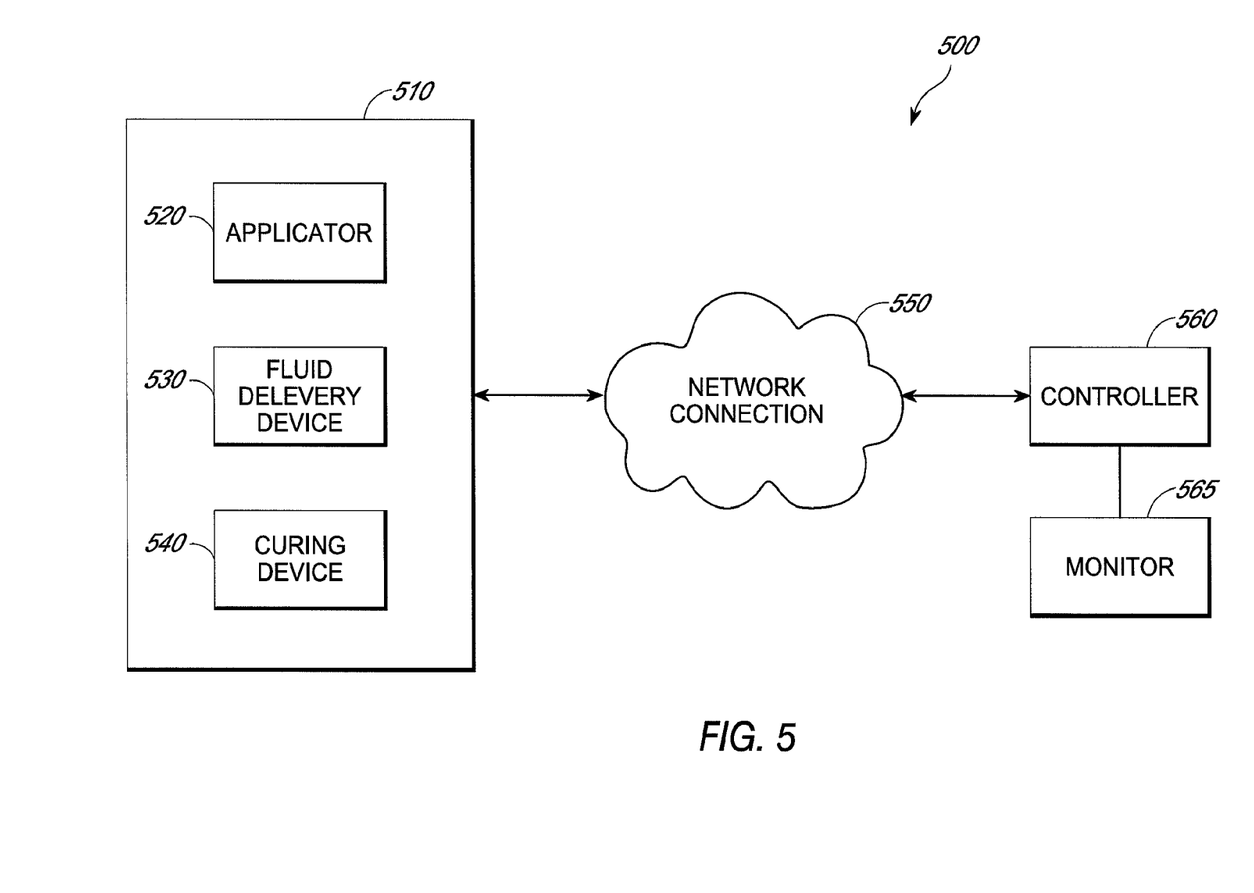
FIG. 5 a block diagram illustrating one example of a system that may control one or more operations in accordance with at least some examples of the present disclosure.

FIG. 5 a block diagram illustrating one example of a system that may control one or more operations in accordance with at least some examples of the present disclosure. For example, equipment for performing operations for the flow diagrams of FIGS. 1 and/or 2 may be included in system 500. While the equipment for performing operations for the flow diagram of FIG. 1 are shown in FIG. 5, the equipment for performing operations associated with FIG. 2 may alternatively be included in system 500.

System 500 may include a processing plant or facility 510 that is arranged in communication with a controller or processor 560. Processor or controller 560 may be the same or different controller as processor 410 described in FIG. 4. In some embodiments, processing plant or facility 510 may be adapted to communicate with controller 560 via a network connection 550. Network connection 550 may be a wireless connection or a wired connection.

In some embodiments, controller 560 may be adapted to provide operating instructions for processing plant 510, which may include, for example, one or more operating conditions. Controller 560 may be configured to receive information from processing plant 510 and utilize the information as feedback to adjust operating instructions to processing plant 510.

In some embodiments, the operating conditions may be presented on a monitor or display 565 and a user may interact with the operating conditions via a user interface (not shown). Non-limiting examples of operating condition that may be presented on monitor or display 565 include time, temperature, pressure, rate of delivering components (e.g., nanoparticles, fluids, etc.), type of nanoparticles, type of polymer or monomer, thickness of applied components, and the like. Monitor 565 may be in the form of a cathode ray tube, a flat panel screen such as an LED display or LCD display, or any other display device. The user interface may include a keyboard, mouse, joystick, write pen or other device such as a microphone, video camera or other user input device.

In some embodiments, processing facility 510 may include one or more of a nanoparticle applicator 520, a fluid delivery device 530, and/or a curing device 540. In some embodiments, nanoparticle applicator 520 may be configured via controller 560 to provide a plurality of nanoparticles to form a nanoparticle film. In some embodiments, nanoparticle applicator 520 may be a spin coating device. In such embodiments, nanoparticle applicator 520 may include a reservoir (not shown) containing a plurality of nanoparticles. The nanoparticles may be any of those described in the present application.

Fluid delivery device 530 may be coupled to controller 560 and can be configured via controller 560 to provide a fluid to the nanoparticle film at conditions sufficient to cause the fluid to occupy at least a portion of voids in the nanoparticle film. As an example, the fluid delivery device may be configured to control the pressure and/or temperature of the fluid to produce a vapor that will condense within the void of the nanoparticle film. The skilled artisan will appreciate that these conditions may vary depending upon the properties of the fluid delivered. As one example, 2-methyl-vinyloxirane can form a vapor at about 1 atm and about 90° C. that may condense upon contacting the nanoparticle film. In some embodiments, the delivery device may maintain low moisture or moisture-free conditions (e.g., a relative humidity below 10%; below 5%; or about 0%). In some embodiments, the fluid delivery device 530 may include a reservoir containing the fluid. The fluid may be an organic fluid and fluid delivery device 530 may be configured to vaporize the fluid. The organic fluid can be the same materials included in the organic vapor described in the present application.

Curing device 540 can be coupled to controller 560 and configured via controller 560 to cure the fluid in the nanoparticle film to form the nanocomposite dielectric film. In some embodiments, the curing device may be configured to apply heat to the nanoparticle film. In some embodiments, the curing device may be configured to apply radiation (e.g., UV, gamma, or electron beam radiation). In some embodiments, the curing device may be configured to contact a fluid with the nanoparticle film, where the fluid causes curing. In some embodiments, curing device 540 may include a reservoir that contains a fluid that can be contacted with the nanoparticle film. As an example, the fluid may include an acid.

While the equipment in FIG. 5 relates to the process of FIG. 1, systems including equipment related to the process of FIG. 2 are also within the scope of the present application. Non-limiting examples of equipment relating to the process of FIG. 2 include a solvent casting device, a comminution device, an applicator, etc. For example, the solvent casting device may be configured via the controller to form a film including a plurality of nanoparticles and an organic medium. The comminution device may be coupled to the controller and configured via the controller to comminute the film into a particulate. The applicator may be coupled to the controller and configured via the controller to apply the particulate to a substrate to form the nanocomposite dielectric film. In some embodiments, the applicator may be configured via the controller to apply the particulate so that it adheres to the substrate (e.g., by applying heat above the melting point or glass transition temperature).

Figure 6:
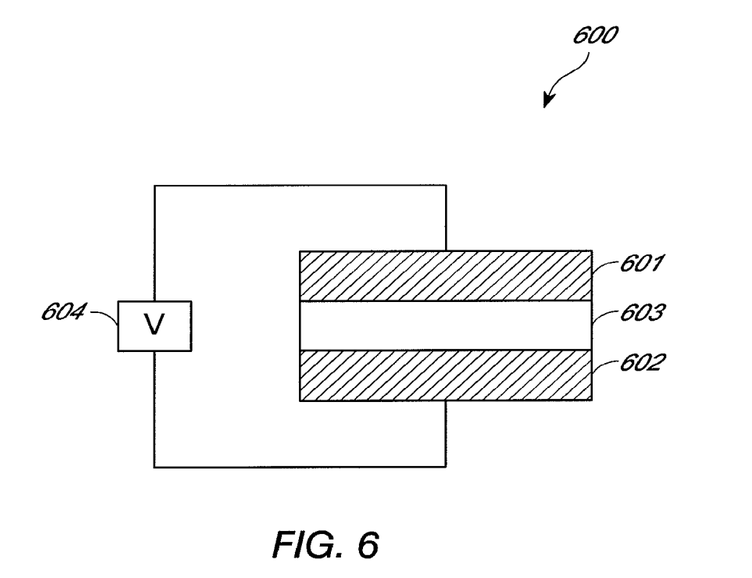
FIG. 6 is a cross-sectional view showing one example of a capacitor with a nanocomposite dielectric film (not to scale), arranged in accordance with at least some examples presented herein.

FIG. 6 is a cross-sectional view showing one example of a capacitor with a nanocomposite dielectric film (not to scale), arranged in accordance with at least some examples presented herein. Nanocomposite dielectric film 603 is disposed between first electrode 601 and second electrode 602 to form capacitor 600. Nanocomposite dielectric film 603 can be any nanocomposite dielectric film described in the present application, such as a film structure obtained by a method depicted in FIG. 1 or FIG. 2.

As shown, first electrode 601 and second electrode 602 may be coupled to an optional voltage source 604. The electrodes 601, 602 may be formed from any conventional conducting or semi-conducting materials. For example, the capacitor 600 can be formed in a silicon-insulator-silicon (SIS) structure, wherein both of the electrodes 601, 602 may be formed of polysilicon. Also, a metal-insulator-silicon (MIS) capacitor structure or a metal-insulator-metal (MIM) capacitor structure can also be used. For the MIS capacitor structure, one electrode may be formed of polysilicon and one electrode may be formed of metal or metal oxide. For the MIM capacitor structure, both of the electrodes may be formed of metal or metal oxide.

Figure 7:
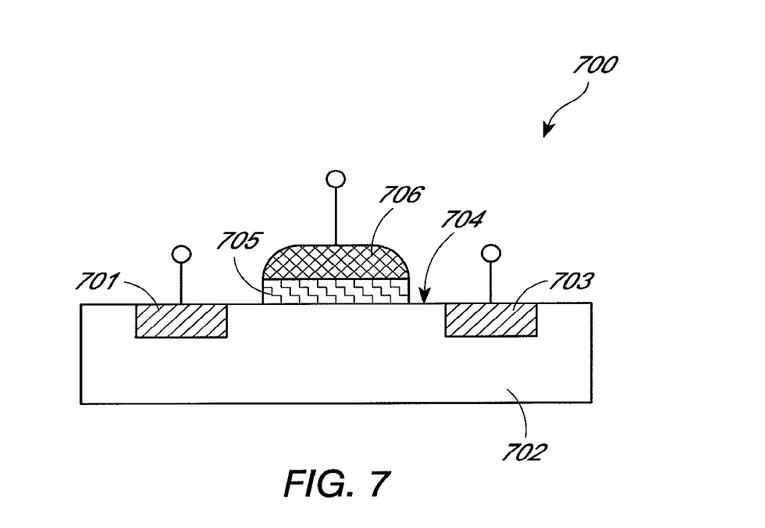
FIG. 7 is a cross-sectional view showing one example of a field-effect transistor (FET) with a nanocomposite dielectric film (not to scale), arranged in accordance with at least some examples presented herein.

FIG. 7 is a cross-sectional view showing one example of a field-effect transistor (FET) with a nanocomposite dielectric film (not to scale), arranged in accordance with at least some examples presented herein. FIG. 7 illustrates transistor 700 having a source region 701, a drain region 703, a channel region 702, and a gate electrode or region 706. As shown, channel region 702 includes a top surface 704. Overlying channel region 702 is gate nanocomposite dielectric film 705.

In some embodiments, gate nanocomposite dielectric film 705 may be interposed between gate electrode 706 and channel region top surface 704. Gate nanocomposite dielectric film 706 can be any nanocomposite dielectric film described in the present application, such as a film structure obtained by a method depicted in FIG. 1 or FIG. 2.

While various aspects and embodiments have been disclosed herein, other aspects and embodiments will be apparent to those skilled in the art having read the present disclosure. The various aspects and embodiments disclosed herein are for purposes of illustration and are not intended to be limiting, with the true scope and spirit being indicated by the following claims.

EXAMPLES

Additional embodiments are disclosed in further detail in the following examples, which are not in any way intended to limit the scope of the claims.

Example 1

100 nm diameter barium titanate nanoparticles are coated with $(PEG)_3PA$ (a phosphonic acid-terminated polyethylene glycol oligomer). The oligomers are spun-coat to form a film, then heated in the presence of the reactive epoxy monomer 2-Methyl-2-vinyloxirane at room pressure and a temperature of about 90° C. The film is removed and cooled to a temperature of about 4° C., whereupon HCl vapor is flowed over it to polymerize the epoxy. After about 20 minutes of exposure to acid, the film is heated to a temperature of about 140° C. to complete the cure.

Example 2

50-100 nm particles of barium titanate are coated with alkyl phosphonic acid. The polymer component is chosen with a low melting point, e.g., a polyolefin based on polyethylene. The polyolefin and nanoparticles are dissolved in a compatible solvent such as toluene, and the solvent is removed to reveal a composite material where the nanoparticle and polymer components are well-mixed.

This composite is cryogenically ground into microscale powder, and coated onto a substrate at a temperature >100° C. by a corona gun. The substrate temperature is raised to >200° C. during annealing to ensure that the polymer can flow over the nanoparticles, and the system is then crosslinked using e-beam or gamma radiation.

The coating can be applied over rough, curved, or otherwise non-uniform surfaces. For example, it can be applied as a microns-thick coating over a curved surface in order to gain additional surface area over what could be achieved over a simple flat, planar surface.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of making a nanocomposite dielectric film comprising:
    providing a nanoparticle film, wherein the film comprises nanoparticles and voids located between the nanoparticles;
    contacting the film with a vapor comprising an organic material so that at least a portion of the organic material occupies at least a portion of the voids; and
    curing the organic material to form the nanocomposite dielectric film.

2. The method of claim 1, wherein the nanoparticles comprise a material that exhibits a dielectric constant greater than about 3.9.

3. The method of claim 1, the nanoparticles comprising an inorganic material.

4. The method of claim 1, the nanoparticles comprising a metal oxide.

5. The method of claim 1, the nanoparticles comprising a metal oxide selected from the group consisting of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), PST ($PbSc_xTa_{1-x}O_3$), and/or combinations thereof.

6. The method of claim 1, wherein the nanoparticles have an average diameter of less than about 1,000 nm.

7. The method of claim 1, the nanoparticles comprising a core and an outer layer, the outer layer comprising a surface modifying agent conjugated to the core.

8. The method of claim 7, wherein surface modifying agent is selected to reduce the surface tension between the nanoparticles and the organic material.

9. The method of claim 7, wherein the surface modifying agent comprises a functional group selected from the group consisting of a phosphonic acid, a siloxane, a carboxylic acid, and/or combinations thereof.

10. The method of claim 9, wherein the surface modifying agent is selected from the group consisting of a phosphonic acid-terminated polyethylene glycol, a siloxane-terminated polyethylene glycol, and a carboxylic acid-terminated polyethylene glycol.

11. The method of claim 1, wherein the organic material is selected from the group consisting of a vinyl monomer, an epoxide, and/or combinations thereof.

12. The method of claim 1, wherein the organic material comprising 2-methyl-2-vinyloxirane.

13. The method of claim 1, wherein curing comprises one or more of applying heat to the organic material, contacting the organic material with an acid, and/or exposing the organic material to ultraviolet radiation.

14. The method of claim 1, wherein the cured organic material exhibits a dielectric strength of at least 10 MV/m.

15. The method of claim 1, wherein providing the nanoparticle film comprises spin coating the nanoparticles to form the nanoparticle film.

* * * * *

UNITED STATES PATENT AND TRADEMARK OFFICE
CERTIFICATE OF CORRECTION

PATENT NO. : 8,889,472 B2  
APPLICATION NO. : 13/260899  
DATED : November 18, 2014  
INVENTOR(S) : Miller Page 1 of 2

It is certified that error appears in the above-identified patent and that said Letters Patent is hereby corrected as shown below:

On the Title Page, Item (56), under "OTHER PUBLICATIONS", in Column 2, Line 1, delete "Paton," and insert -- Patton, --, therefor.

On Title Page 2, Item (56), under "OTHER PUBLICATIONS", in Column 1, Line 4, delete "BaTiO3" and insert -- $BaTiO_3$ --, therefor.

On Title Page 2, Item (56), under "OTHER PUBLICATIONS", in Column 1, Line 11, delete "BaTiO3/" and insert -- $BaTiO_3$/ --, therefor.

On Title Page 2, Item (56), under "OTHER PUBLICATIONS", in Column 1, Line 14, delete "BaTiO3" and insert -- $BaTiO_3$ --, therefor.

On Title Page 2, Item (56), under "OTHER PUBLICATIONS", in Column 2, Line 1, delete "Kim, et al," and insert -- Kim, et al., --, therefor.

In the Drawings

In Fig. 2, Sheet 1 of 6, for Tag "202", in Line 1, delete "COMMINATE" and insert -- COMMINUTE --, therefor.

In Fig. 4, Sheet 4 of 6, delete "uP/uC/DSP" and insert -- $\mu P/\mu C/DSP$ --, therefor.

In Fig. 4, Sheet 4 of 6, for Tag "415", in Line 2, delete "CONTROLER" and insert -- CONTROLLER --, therefor.

In Fig. 4, Sheet 4 of 6, for Tag "471", in Line 3, delete "CONTROLER" and insert -- CONTROLLER --, therefor.

Signed and Sealed this  
Twenty-fifth Day of August, 2015

Michelle K. Lee  
*Director of the United States Patent and Trademark Office*

In Fig. 4, Sheet 4 of 6, for Tag "472", in Line 1, delete "PARALLED" and insert -- PARALLEL --, therefor.

In Fig. 4, Sheet 4 of 6, for Tag "465", in Line 2, delete "DELIVERARY" and insert -- DELIVERY --, therefor.

In Fig. 5, Sheet 5 of 6, for Tag "530", in Line 2, delete "DELEVERY" and insert -- DELIVERY --, therefor.

In the Specification

In Column 1, Line 3, below Title, insert -- CROSS-REFERENCE TO RELATED APPLICATION
The present application is a U.S. national stage filing under 35 U.S.C. §371 of International Application No. PCT/US2011/032326, filed on April 13, 2011, the entire contents of which are incorporated herein by reference. --.

In Column 3, Line 13, delete "FIG. 5" and insert -- FIG. 5 is --, therefor.

In Column 8, Line 18, delete "Film " In" and insert -- Film." In --, therefor.

In Column 10, Line 12, delete "registers 214." and insert -- registers 414. --, therefor.

In Column 10, Line 38, delete "thereof" and insert -- thereof. --, therefor.

In Column 10, Line 67, delete "AN" and insert -- A/V --, therefor.

In Column 11, Line 28, delete "FIG. 5" and insert -- FIG. 5 is --, therefor.